(12) United States Patent
Kikuchi et al.

(10) Patent No.: US 6,404,282 B2
(45) Date of Patent: Jun. 11, 2002

(54) PREAMPLIFICATION CIRCUIT

(75) Inventors: Tsuneo Kikuchi; Yuichi Sato, both of Miyagi (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/852,738

(22) Filed: May 11, 2001

(30) Foreign Application Priority Data

May 12, 2000 (JP) ........................................ 2000-140140

(51) Int. Cl.⁷ ................................................ H03F 1/36
(52) U.S. Cl. ........................... 330/86; 330/110; 330/282
(58) Field of Search ............................. 330/51, 85, 86, 330/110, 282, 291, 292, 293

(56) References Cited

U.S. PATENT DOCUMENTS

| | | | | |
|---|---|---|---|---|
| 6,114,910 A | * | 9/2000 | Goff | 330/133 |
| 6,140,878 A | * | 10/2000 | Masuta | 330/86 |
| 6,246,284 B1 | * | 6/2001 | Nemoto | 330/86 |
| 6,307,433 B1 | * | 10/2001 | Ikeda | 330/86 |

FOREIGN PATENT DOCUMENTS

| | | | | |
|---|---|---|---|---|
| JP | 60-85613 | 5/1985 | | |
| JP | 2-289904 | 11/1990 | | |
| JP | 8-102716 | 4/1996 | | |
| JP | 9-8563 | 1/1997 | | |
| JP | 10-13172 | 1/1998 | | |
| JP | 2737718 | 1/1998 | | |
| JP | 2001237653 | * | 8/2001 | ............. H03F/3/08 |

* cited by examiner

*Primary Examiner*—Robert Pascal
*Assistant Examiner*—Khanh V. Nguyen
(74) *Attorney, Agent, or Firm*—McGinn & Gibb, PLLC

(57) ABSTRACT

According to a level of an input signal, first switching means performs control in such a way that only a first feedback resistor or the first and second feedback resistors become feedback resistors connected to amplifying means, and thereby allows the amplifying means to keep linearity without saturating even when the level of the input signal changes. Furthermore, when the input signal has a higher level than a predetermined threshold, a phase compensation capacitor is charged under the control of second switching means for phase compensation of the amplifying means. However, even when the input signal has a lower level than the predetermined threshold, the phase compensation capacitor is charged at predetermined timing under the control of third switching means, preventing a high current from being pulled into the amplifying means when the input signal changes from a lower level than the predetermined threshold to a higher level than the predetermined threshold, thereby reducing noise applied to an output signal.

14 Claims, 3 Drawing Sheets

PREAMPLIFICATION CIRCUIT

BACKGROUND OF THE INVENTION

1. Field of the Invention

The present invention relates to a preamplification circuit that controls large signal inputs.

2. Description of the Related Art

FIG. 1 is a circuit diagram showing a configuration example of a conventional preamplification circuit.

As shown in FIG. 1, this conventional example comprises inverse amplifier 1 for amplifying and outputting a preamp input signal, buffer circuit 2 for buffering and outputting the signal outputted from inverse amplifier 1, feedback resistors 3 and 4 connected in parallel to each other between the input terminal of inverse amplifier 1 and the output terminal of buffer circuit 2 for changing the gain of inverse amplifier 1, phase compensation capacitor 7 connected between the input terminal and output terminal of inverse amplifier 1 for compensating the phase of inverse amplifier 1, FET switch 5 for switching the connection between feedback resistor 4 and inverse amplifier 1, buffer circuit 2 based on a gain switching signal supplied and FET switch 6 for switching between charge/discharge of phase compensation capacitor 7 based on the gain switching signal. The signal outputted from buffer circuit 2 is outputted as a preamp output signal (see Japanese Patent Laid-Open No. 1997-8563).

In the preamplification circuit in the above described configuration, the gain switching signal is fixed to LOW while the preamp input signal stays at a low level, which keeps OFF FET switch 5. As a result, feedback resistor 3 is the only feedback resistor to control the gain of inverse amplifier 1. Furthermore, FET switch 6 is turned OFF, and therefore phase compensation capacitor 7 is left open and discharged, and phase compensation is not performed using phase compensation capacitor 7 for inverse amplifier 1.

On the other hand, while the preamp input signal stays at a high level, the gain switching signal is HIGH, which turns ON FET switch 5. In this way, feedback resistors 3 and 4 function as the feedback resistors to control the gain of inverse amplifier 1. As a result, the gain of inverse amplifier 1 becomes smaller than when the preamp input signal stays at a low level. Furthermore, FET switch 6 turns ON, which causes phase compensation capacitor 7 to be charged with the preamp input signal, and in this way, phase compensation is performed for inverse amplifier 1.

In the conventional preamplification circuit above, charging to phase compensation capacitor 7 starts when the gain switching signal changes from LOW to HIGH.

As shown in FIG. 2, in this conventional example, charging to phase compensation capacitor 7 starts at the timing at which the preamp input signal changes from a low level signal to a high level signal and the gain switching signal changes from LOW to HIGH. However, if input of the low level signal persists long time, the amount of discharge of phase compensation capacitor 7 increases, and then when the preamp input signal becomes a high level signal and the gain switching signal becomes HIGH, a high current is pulled into inverse amplifier 1. This introduces large noise to the preamp output signal, causing a problem of adversely affecting the circuits that follow.

SUMMARY OF THE INVENTION

It is an object of the present invention to provide a preamplification circuit capable of reducing noise applied to a preamp output signal when the preamp input signal changes from a low level signal to a high level signal.

In the present invention, when an input signal having a lower level than a predetermined threshold is supplied, first switching means performs control in such a way that the first feedback resistor is the only feedback resistor connected to amplifying means and the gain of the amplifying means is controlled only by the first feedback resistor. Then, when the input signal has a higher level than the predetermined threshold, the first switching means performs control in such a way that the feedback resistors connected to the amplifying means become the first and second feedback resistors connected in parallel to each other, thereby the gain of the amplifying means is controlled by the resistance value of the first and second feedback resistors connected in parallel. This allows the amplifying means to keep linearity without saturating even when the input signal changes from a lower level than the predetermined threshold to a higher level than the predetermined threshold.

Here, when an input signal having a higher level than the predetermined threshold is supplied, the phase compensation capacitor is charged under the control of the second switching means for phase compensation of the amplifying means. However, even when the input signal has a lower level than the predetermined threshold, the phase compensation capacitor is charged at predetermined timing under the control of third switching means, preventing a high current from being pulled into the amplifying means when the input signal changes from a lower level than the predetermined threshold to a higher level than the predetermined threshold, thus reducing noise applied to the output signal.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

First Embodiment

Figure 3:
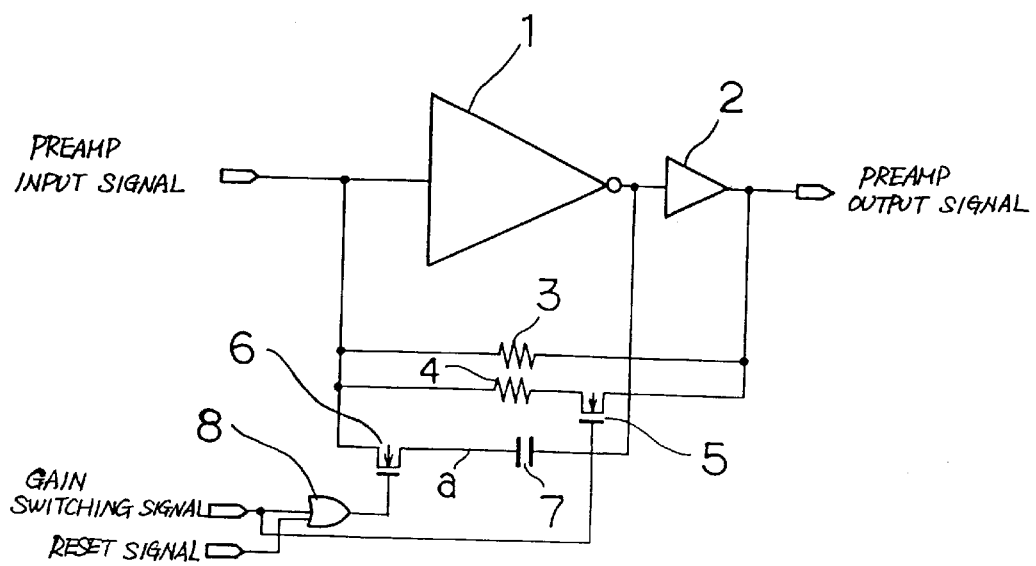
FIG. 3 is a circuit diagram showing a first embodiment of the preamplification circuit of the present invention.

As shown in FIG. 3, this embodiment comprises inverse amplifier 1 for amplifying and outputting a preamp input signal, buffer circuit 2 for buffering and outputting the signal outputted from inverse amplifier 1, first and second feedback resistors 3 and 4 connected in parallel to each other between the input terminal of inverse amplifier 1 and the output terminal of buffer circuit 2 for changing the gain of inverse amplifier 1, phase compensation capacitor 7 connected between the input terminal and output terminal of inverse amplifier 1 for compensating the phase of inverse amplifier 1, FET switch 5 as first switching means for switching the connection between the feedback resistor 4 and inverse amplifier 1, buffer circuit 2 based on a gain switching signal supplied, FET switch 6 as second switching means for switching between charge/discharge of phase compensation capacitor 7 based on the gain switching signal or a reset signal and an OR gate 8 as third switching means, whose input terminal is supplied the gain switching signal and the reset signal and output terminal is connected to the gate of FET switch 6. A signal outputted from buffer circuit 2 is outputted as a preamp output signal. The resistance values of feedback resistors 3 and 4 have a relationship: (a resistance value of the feedback resistor 3)>>(a resistance value of the feedback resistor 4)

Figure 4:
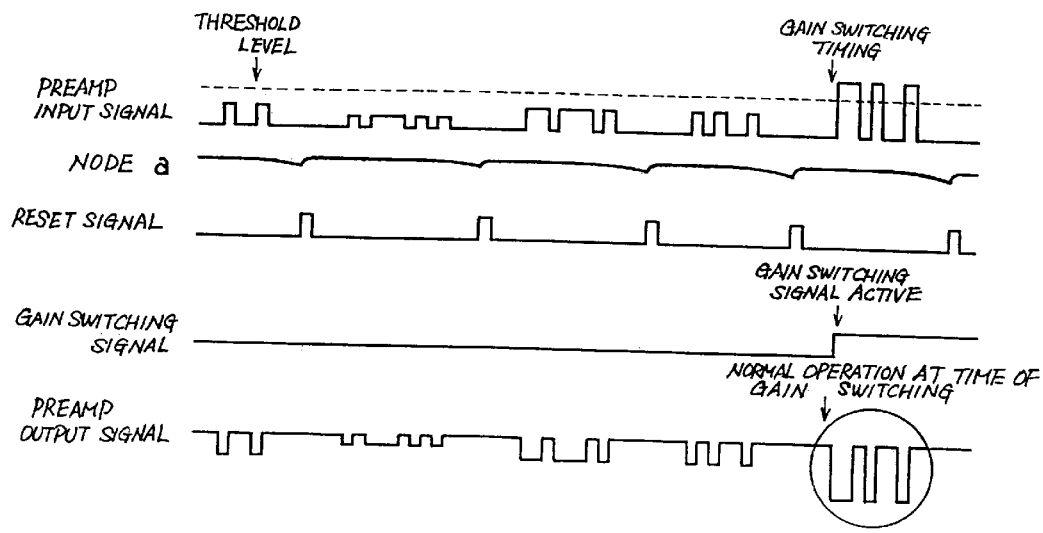
FIG. 4 is a timing chart to explain an operation of the preamplification circuit shown in FIG. 3.
Figure 1:
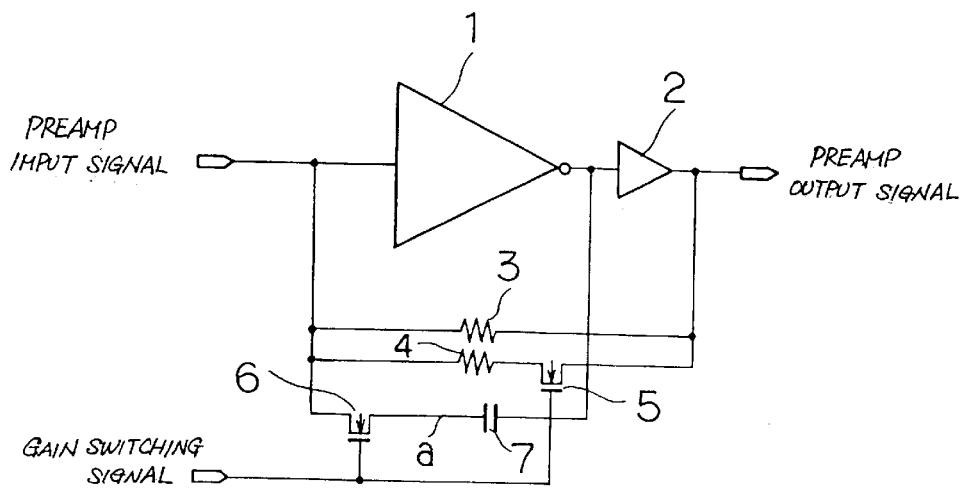
FIG. 1 is a circuit diagram showing a configuration example of a conventional preamplification circuit.
Figure 2:
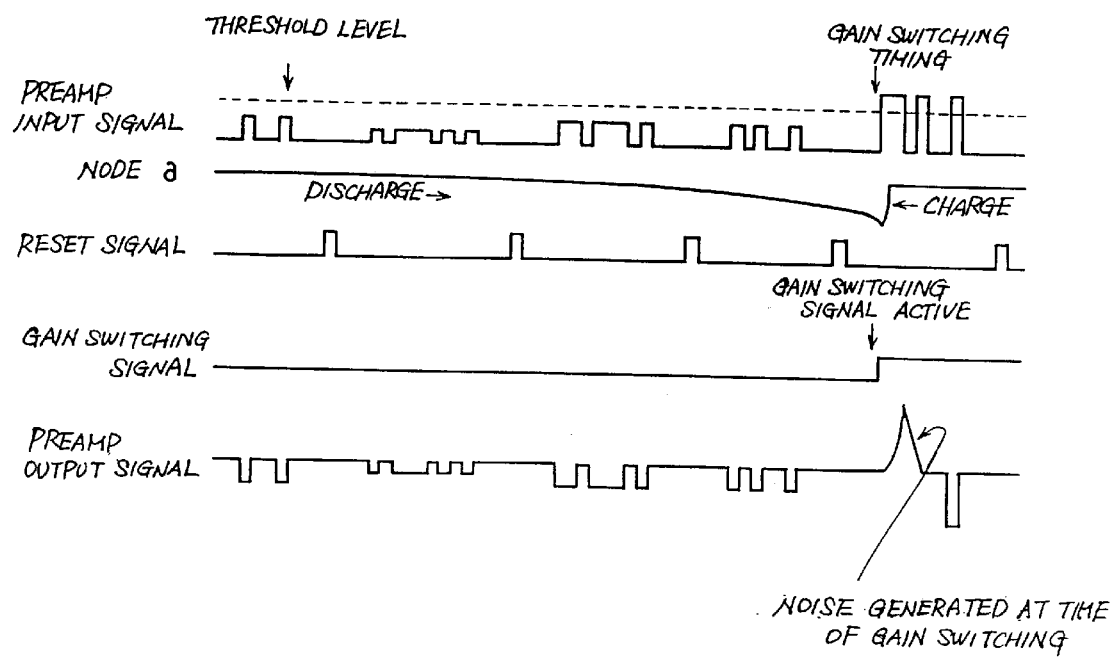
FIG. 2 is a timing chart to explain an operation of the preamplification circuit shown in FIG. 1.

The operation of the preamplification circuit in the above configuration will be explained with reference to FIG. 4.

When a preamp input signal having a lower level than a predetermined threshold is supplied, the gain switching signal is fixed to LOW, which keeps OFF FET switch 5. As a result, feedback resistor 3 is the only feedback resistor to control the gain of inverse amplifier 1 and the signal amplified with this gain is outputted as a preamp output signal.

Here, when the preamp input signal is supplied, the reset signal becomes HIGH for every data supplied and then the data is supplied.

For this reason, even when the gain switching signal is LOW, the HIGH level of the reset signal is transmitted to the gate of FET switch 6 via OR gate 8 and FET switch 6 turns ON every time the reset signal becomes HIGH.

This causes phase compensation capacitor 7 to be charged every time the preamp input signal is supplied even when the gain switching signal is LOW, which means that the amount of discharge of phase compensation capacitor 7 will no longer increase.

Then, when the preamp input signal has a higher level than the predetermined threshold, the gain switching signal becomes HIGH, which turns ON FET switch 5. Thus, the gain of inverse amplifier 1 is controlled by feedback resistors 3 and 4 and the signal amplified with the gain is outputted as the preamp output signal. That is, the gain of inverse amplifier 1 becomes smaller than when the preamp input signal has a lower level than the predetermined threshold. As a result, inverse amplifier 1 keeps linearity without saturating.

Furthermore, the HIGH level of the gain switching signal is transmitted to the gate of FET switch 6 via OR gate 8, which turns ON FET switch 6 causing phase compensation capacitor 7 to be charged. This allows the phase of inverse amplifier 1 to be compensated. Here, even when the gain switching signal is LOW, phase compensation capacitor 7 is charged by the HIGH level of the reset signal every time the preamp input signal is supplied, preventing any high current from being pulled into inverse amplifier 1 and preventing noise from applying to the preamp output signal.

In this Embodiment, FET switches 5 and 6 are used as the first and second switching means, but the present invention is not limited to this and other switches can also be used.

Second Embodiment

Figure 5:
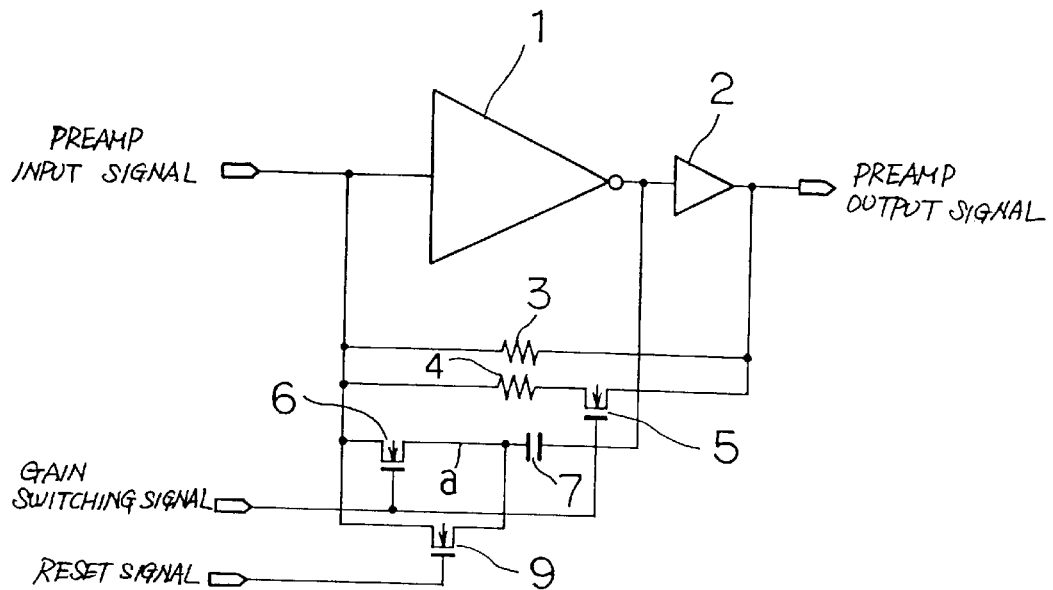
FIG. 5 is a circuit diagram showing a second embodiment of the preamplification circuit of the present invention.

As shown in FIG. 5, this embodiment comprises inverse amplifier 1 for amplifying and outputting a preamp input signal, buffer circuit 2 for buffering and outputting the signal outputted from inverse amplifier 1, first and second feedback resistors 3 and 4 connected in parallel to each other between the input terminal of inverse amplifier 1 and the output terminal of buffer circuit 2 for changing the gain of inverse amplifier 1, phase compensation capacitor 7 connected between the input terminal and output terminal of inverse amplifier 1 for compensating the phase of inverse amplifier 1, FET switch 5 as first switching means for switching the connection between the feedback resistor 4 and inverse amplifier 1, buffer circuit 2 based on a gain switching signal supplied, FET switch 6 as second switching means for switching between charge/discharge of phase compensation capacitor 7 based on the gain switching signal and an FET switch 9 as third switching means for switching between charge/discharge of phase compensation capacitor 7 based on a reset signal that becomes HIGH every time a preamp input signal is supplied. A signal outputted from buffer circuit 2 is outputted as a preamp output signal. The resistance values of feedback resistors 3 and 4 have a relationship: (a resistance value of the feedback resistor 3)>>(a resistance value of the feedback resistor 4)

The operation of the preamplification circuit in the above configuration will be explained below.

When a preamp input signal having a lower level than a predetermined threshold is supplied, the gain switching signal is fixed to LOW, which keeps OFF FET switch 5. As a result, feedback resistor 3 is the only feedback resistor to control the gain of inverse amplifier 1 and the signal amplified with this gain is outputted as a preamp output signal.

Here, when the preamp input signal is supplied, the reset signal becomes HIGH for every data supplied and then the data is supplied.

For this reason, even when the gain switching signal is LOW, the HIGH level of the reset signal is transmitted to the gate of FET switch 9 and FET switch 9 turns ON every time the reset signal becomes HIGH.

This causes phase compensation capacitor 7 to be charged every time the preamp input signal is supplied even when the gain switching signal is LOW, which means that the amount of discharge of phase compensation capacitor 7 will no longer increase.

Then, when the preamp input signal has a higher level than the predetermined threshold, the gain switching signal becomes HIGH, which turns ON FET switch 5. Thus, the gain of inverse amplifier 1 is controlled by feedback resistors 3 and 4 and the signal amplified with the gain is outputted as the preamp output signal. That is, the grain of inverse amplifier 1 becomes smaller than when the preamp input signal has a lower level than the predetermined threshold. As a result, inverse amplifier 1 keeps linearity without saturating.

Furthermore, the HIGH level of the gain switching signal is transmitted to the gate of FET switch 6, which turns ON FET switch 6 causing phase compensation capacitor 7 to be charged. This allows the phase of inverse amplifier 1 to be compensated. Here, even when the gain switching signal is LOW, phase compensation capacitor 7 is charged by the HIGH level of the reset signal every time the preamp input signal is supplied, preventing any high current from being pulled into inverse amplifier 1 and preventing noise from applying to the preamp output signal.

In this embodiment, FET switches 5, 6 and 9 are used as the first to third switching means, but the present invention is not limited to this and other switches can also be used.

While preferred embodiments of the present invention have been described using specific terms, such description is for illustrative purposes only, and it is to be understood that changes and variations may be made without departing from the spirit or scope of the following claims.

What is claimed is:

1. A preamplification circuit, comprising:

amplifying means for amplifying and outputting an input signal;

first and second feedback resistors connected in parallel to each other between an input terminal and an output terminal of said amplifying means;

first switching means for switching a connection between said amplifying means and said second feedback resistor;

a phase compensation capacitor for compensating a phase of said amplifying means;

second switching means for changing said phase compensation capacitor when said input signal has a higher level than a predetermined threshold; and third switching means for charging said phase compensation capacitor at predetermined timing, wherein a gain of said amplifying means is switched by using said first and second feedback resistors or only said first feedback resistor as the feedback resistor connected to said amplifying means by the switching of said first switching means.

2. The preamplification circuit according to claim 1, wherein said third switching means charges said phase compensation capacitor based on a reset signal supplied every time said input signal is supplied.

3. The preamplification circuit according to claim 2, wherein said first and second switching means are FET switches.

4. The preamplification circuit according to claim 2, wherein said third switching means is an OR gate that controls said second switching means so that said phase compensation capacitor is charged in the case where either said reset signal is supplied or a gain switching signal that controls said second switching means when said input signal has a higher level than a predetermined threshold.

5. The preamplification circuit according to claim 3, wherein said third switching means is an OR gate that controls said second switching means so that said phase compensation capacitor is charged in the case where either said reset signal is supplied or a gain switching signal that controls said second switching means when said input signal has a higher level than a predetermined threshold.

6. The preamplification circuit according to claim 2, wherein said third switching means is a FET switch.

7. The preamplification circuit according to claim 3, wherein said third switching means is a FET switch.

8. The preamplification circuit according to claim 1, wherein a resistance value of said first feedback resistor is larger than a resistance value of said second feedback resistor.

9. The preamplification circuit according to claim 2, wherein a resistance value of said first feedback resistor is larger than a resistance value of said second feedback resistor.

10. The preamplification circuit according to claim 3, wherein a resistance value of said first feedback resistor is larger than a resistance value of said second feedback resistor.

11. The preamplification circuit according to claim 4, wherein a resistance value of said first feedback resistor is larger than a resistance value of said second feedback resistor.

12. The preamplification circuit according to claim 5, wherein a resistance value of said first feedback resistor is larger than a resistance value of said second feedback resistor.

13. The preamplification circuit according to claim 6, wherein a resistance value of said first feedback resistor is larger than a resistance value of said second feedback resistor.

14. The preamplification circuit according to claim 7, wherein a resistance value of said first feedback resistor is larger than a resistance value of said second feedback resistor.

* * * * *